United States Patent [19]
Liang

[11] Patent Number: 5,885,855
[45] Date of Patent: Mar. 23, 1999

[54] METHOD FOR DISTRIBUTING CONNECTION PADS ON A SEMICONDUCTOR DIE

[75] Inventor: Mike Liang, Milpitas, Calif.

[73] Assignee: LSI Logic Corporation, Milpitas, Calif.

[21] Appl. No.: 909,312

[22] Filed: Aug. 14, 1997

Related U.S. Application Data

[62] Division of Ser. No. 747,325, Nov. 12, 1996.

[51] Int. Cl.$^6$ .................................................. H01L 21/82
[52] U.S. Cl. ........................................... 438/128; 438/598
[58] Field of Search .................................. 438/707, 108, 438/128, 129, 598, 599

[56] References Cited

U.S. PATENT DOCUMENTS

| | | |
|---|---|---|
| 3,894,860 | 7/1975 | Logue . |
| 4,792,532 | 12/1988 | Ohtani et al. . |
| 4,860,087 | 8/1989 | Matsubara et al. . |
| 4,978,633 | 12/1990 | Seefeldt et al. ......................... 438/113 |

(List continued on next page.)

FOREIGN PATENT DOCUMENTS 5144879  6/1993  Japan .

OTHER PUBLICATIONS

A Low Cost Multichip Module Using Flex Substrate and Ball Grid Array, ICEMCM '96 Proceedings, pp. 28–32.

Electrical Characterization of the Interconnected Mesh Power System (IMPS) MCM Topology, IEEE Transactions on Components, Packaging, and Manufacturing Technology–Part B, Vol. 18, No. 1, Feb. 1995, pp. 99–105.

Design of the Interconnected Mesh Power System (IMPS) MCM Topology, MCM '94 Proceedings, pp. 543–548.

A Signal–Noise Comparison of the Interconnected Mesh Power System (IMPS) with a Standard Four–Layer MCM Topology, 1996, Michael D. Glover et al.

A Design Methodolgy for the Interconnected Mesh Power System (IMPS) MCM Technology, 1995 IEPS Conference, pp. 192–196.

Theory and Experimental Confirmation of the Interconnected Mesh Power System (IMPS) MCM Topolgy, The International Journal of Microcircuits and Electornic Packaging, vol. 18, No. 2, 2ND Quarter 1995 (ISSN 1063–1674), pp. 146–153.

*Primary Examiner*—Kevin M. Picardat
*Attorney, Agent, or Firm*—Oppenheimer Wolf & Donnelly LLP

[57] ABSTRACT

An arrangement of bump pads for use on a face of a flip-chip semiconductor die. The arrangement comprises four corner regions, each corner region comprising multiple I/O bump pads and power bump pads. The corner regions are specialized bump arrangements depending upon the size of the die, signal to power ratios, and the core power requirements. The die arrangement also comprises multiple edge regions having multiple I/O bump pads and power bump pads. The edge regions are located along the edges of the die and are interleaved between the corner regions. The dimensions of the corner regions and the edge regions depend upon the power to signal ratio of the region. Also provided is a core power region having multiple power bump pads, centrally located within the edge regions and the corner groups. Core requirements mandating an odd number of rows and columns of bumps for the core require a special "checkerboard" arrangement also provided. Connections between the bumps and the edge of the die surface are shown. According to a second embodiment, there is provided a die surface arrangement with two power bumps, one live voltage, or power, bump and one ground bump, and multiple I/O bumps, all bumps linearly aligned, with the ground and power bumps both located intermediate between the I/O bumps. The ground, power, and I/O bumps form an array, and this array is replicated linearly across the die surface forming a linear array arrangement having alternately directed redistribution traces. The die surface arrangement comprises multiple linear array arrangements interspersed with multiple linearly aligned core power bumps.

19 Claims, 9 Drawing Sheets

U.S. PATENT DOCUMENTS

| | | | |
|---|---|---|---|
| 5,066,831 | 11/1991 | Spielberger et al. . | |
| 5,153,507 | 10/1992 | Fong et al. . | |
| 5,239,448 | 8/1993 | Perkins et al. | 361/764 |
| 5,258,648 | 11/1993 | Lin | 257/778 |
| 5,281,151 | 1/1994 | Arima et al. | 439/68 |
| 5,341,049 | 8/1994 | Shimizu et al. . | |
| 5,381,307 | 1/1995 | Hertz et al. | 367/767 |
| 5,391,917 | 2/1995 | Gilmour et al. | 257/690 |
| 5,422,441 | 6/1995 | Iruka . | |
| 5,490,040 | 2/1996 | Gaudenzi et al. . | |
| 5,510,758 | 4/1996 | Fujita et al. | 333/247 |
| 5,523,622 | 6/1996 | Harada et al. | 257/734 |
| 5,545,923 | 8/1996 | Barber . | |
| 5,672,911 | 9/1997 | Patil et al. . | |
| 5,686,764 | 11/1997 | Fulcher . | |
| 5,703,402 | 12/1997 | Chu et al. . | |

FIG. 4C

|     | S1 | S1 | S1 | S1 | S1 | VDD1 | VSS1 |
| --- | --- | --- | --- | --- | --- | --- | --- |
|     | ○ | ○ | ○ | ○ | ○ | ○ | ○ |
|     | S2 | S3 | S3 | S3 | S3 | VDD3 | VSS3 |
|     | ○ | ○ | ○ | ○ | ○ | ○ | ○ |
|     | S2 | S2 | S3 | S5 | S5 | VDD5 | VSS5 |
|     | ○ | ○ | ○ | ○ | ○ | ○ | ○ |
|     | S2 | S4 | S4 | S5 | S5 | S5 | S7 |
|     | ○ | ○ | ○ | ○ | ○ | ○ | ○ |
|     | S2 | S4 | S4 | S6 | S7 | VDD7 | VSS7 |
|     | ○ | ○ | ○ | ○ | ○ | ○ | ○ |
|     | VDD2 | VDD4 | S4 | VDD6 | S6 | S7 | S7 |
|     | ○ | ○ | ○ | ○ | ○ | ○ | ○ |
|     | VSS2 | VSS4 | S6 | VSS6 | S6 | S6 | S7 |
|     | ○ | ○ | ○ | ○ | ○ | ○ | ○ |

FIG. 4D

|     | S1 | S1 | S1 | S1 | S1 | S1 | VDD1 | VSS1 |
| --- | --- | --- | --- | --- | --- | --- | --- | --- |
|     | ○ | ○ | ○ | ○ | ○ | ○ | ○ | ○ |
|     | S2 | S3 | S3 | S3 | S3 | S3 | VDD3 | VSS3 |
|     | ○ | ○ | ○ | ○ | ○ | ○ | ○ | ○ |
|     | S2 | S2 | S3 | S5 | S5 | S5 | VDD5 | VSS5 |
|     | ○ | ○ | ○ | ○ | ○ | ○ | ○ | ○ |
|     | S2 | S4 | S4 | S5 | S5 | S5 | S7 | S7 |
|     | ○ | ○ | ○ | ○ | ○ | ○ | ○ | ○ |
|     | S2 | S4 | S4 | S6 | S7 | S7 | VDD7 | VSS7 |
|     | ○ | ○ | ○ | ○ | ○ | ○ | ○ | ○ |
|     | S2 | S4 | S4 | S6 | S6 | S7 | S7 | S8 |
|     | ○ | ○ | ○ | ○ | ○ | ○ | ○ | ○ |
|     | VDD2 | VDD4 | S6 | VDD6 | S6 | S8 | VDD8 | S8 |
|     | ○ | ○ | ○ | ○ | ○ | ○ | ○ | ○ |
|     | VSS2 | VSS4 | S6 | VSS6 | S8 | S8 | VSS8 | S8 |
|     | ○ | ○ | ○ | ○ | ○ | ○ | ○ | ○ |

METHOD FOR DISTRIBUTING CONNECTION PADS ON A SEMICONDUCTOR DIE

CROSS REFERENCE TO RELATED APPLICATION

This is a divisional of copending application Ser. No. 08/747,325, filed Nov. 12, 1996.

BACKGROUND OF THE INVENTION

1. Field of the Invention

This invention relates to integrated circuit packaging, and more particularly to an efficiently designed integrated circuit flip-chip die providing access to chip signals.

2. Description of the Related Art

Modern high performance integrated circuit, or IC, chips require large numbers of interconnections between the upper level IC structure, or die, and the lower level IC structure, or package. The large number of interconnections are necessary to perform complex operations. Prior methods for providing these interconnections include wire bonding, wherein the die is mounted to the package or substrate with connections between the top surface of the die and the surface of the package. The die and package are then mounted to the motherboard. Another known method for providing connections is through tape automated bonding (TAB). These methods are inherently inefficient for providing power and I/O to the die because limited space is available on the periphery of the die for wire bond or tape pads. Space at the periphery of the die which must be used for bonding translates into space which is unavailable for active circuitry. Further, the resistance and limited inductance associated with the wiring connecting the surface of the die to the package is frequently inadequate for ICs having high performance requirements.

As modern ICs perform numerous functions, package terminals and die conductors are constantly requiring a greater number of I/O and power connections. With current ICs sometimes requiring thousands of connections within a limited space on the die, terminal sizing and spacing must be highly precise in order to form the proper connection between the die and the terminal pattern formed on the associated package.

A method used to join the die to the package which provides adequate bonding and power-I/O capability is the "flip-chip" packaging process. The flip-chip process utilizes an IC flip-chip, which is a monolithic semiconductor unit having bead-like solder bump terminals provided on one face of the chip. These bumps are densely packed together on the die surface, thereby facilitating electrical connections to the substrate. A flip-chip configuration provides access to more core area for a given die size. Bump pitches of 250 micrometers on the surface of the flip-chip is typical. Allowing bumps over active circuitry yields greater silicon utilization. The proximity of the solder bumps on, the die to the associated terminals on the package have the further benefit of decreasing the overall resistance in transmitting power or signals between the package and the die, improving overall system performance.

The problem with flip-chip designs is providing an efficient arrangement and orientation of the interconnections from the bumps to the outlying packaging. High performance ICs frequently require hundreds or even thousands of interconnections for input/output (I/O) or power and ground. Flip-chip interconnections must satisfy power ratio constraints, where the number of I/O interconnections drive the total number of power connections on the chip. The ratio between the number of I/O connections and power connections to support modern chip specifications are in the 4 to 1 range. I/O to power ratios of 5 to 1 or 6 to 1 are not unusual. These power ratios translate into a requirement that no more than four times as many I/O connections as power source connections can exist between the die and the package.

Pitch requirements typically mandate regular intervals between the bumps, further limiting bump placement and organization. Current pitch requirements for typical package-die arrangements are approximately 8 to 10 mils (center-to-center) between bumps for a flip-chip configuration.

It is an object of the current invention to provide an adaptable and efficient flip-chip distribution on the surface of a die for a packaging arrangement requiring hundreds or thousands of interconnections between the semiconductor die and package, whereby the arrangement provides maximum usage of the die surface for a given pitch ratio.

It is a further object of the current invention to provide an adaptable packaging arrangement able to support and efficiently operate an IC chip with a signal to power ratio down to four to one and an I/O cell pitch of approximately 2.5 mils.

It is another object of the current invention to provide an adaptable packaging arrangement which adequately and efficiently provides power to the chip core while satisfying the aforementioned design constraints.

SUMMARY OF THE INVENTION

According to the preferred embodiment of the present invention, there is provided an arrangement of bump pads for use on a face of a semiconductor die. The arrangement comprises four corner regions, each corner region comprising multiple I/O bump pads and power bump pads. The corner regions adjoin two edges of said die, and layout of the corner region is a specialized arrangement depending upon the size of the die, signal to power ratios, and the core power requirements. The arrangement also comprises multiple edge regions having multiple I/O bump pads and power bump pads. The edge regions are located along the edges of the die and are interleaved between the corner regions.

The dimensions of the corner regions and the edge regions depend upon the power to signal ratio of the region. For a power to signal ratio of four to one, as shown in the preferred embodiment, four I/O signals per power signal pair (Vdd and Vss), exclusive of the core power required, is provided herein. For such an arrangement, a corner region of six by six, or thirty six bumps, is provided arranged according to an method which designates the layout of the corner region to provide multiple sectors where power bump pads adjoin the edge of the die surface.

Also provided in the preferred embodiment is a core power region having multiple power bump pads. This power region is centrally located within the edge regions and the corner groups. As the core requirements may mandate an odd number of rows and columns of bumps for the core, an alternate embodiment provides a "checkerboard" arrangement wherein a balanced number of core power regions transmit power along power rails to the edge of the die surface.

With respect to bump connections, the preferred embodiment has multiple power rails connecting the core power bumps to the edge of the surface of the die, where there is located a power ring. This power ring connects the Vdd and Vss signals for all corner regions and edge regions, thereby providing power to the IC. The I/O bumps are connected to I/O cells, and connections from I/O bumps to I/O cells requires that the I/O bump furthest from the I/O cell or power bumps be in one direction, such as to the right, while the second furthest I/O bump connect to its I/O cell in the opposite direction. All remaining bumps are directionally balanced, and in the preferred embodiment, first and fourth bumps emanate redistribution traces in one direction, such as rightward, while second and fourth are in the opposite direction, such as leftward. Adjacent linear arrays have redistribution traces emanating in opposite directions, such that the first I/O signal in one array emanates in a direction, such as rightward, while the first I/O signal in the adjacent arrays emanate in the opposite direction, say leftward.

According to a second embodiment provided herein, there is provided a die surface arrangement for use where core power is not critical, or signal to power ratios are of little import. According to this second embodiment, there is provided a die surface arrangement with two power bumps, one live voltage, or power, bump and one ground bump, and multiple I/O bumps, all bumps linearly aligned, with the ground and power bumps both located intermediate between the I/O bumps. The ground, power, I/O bumps form an array, and this array is replicated linearly across the die surface forming a linear array arrangement, where preferably redistribution traces for adjacent arrays emanate in opposite directions. The die surface arrangement comprises multiple linear array arrangements interspersed with multiple linearly aligned core power bumps.

Other objects, features, and advantages of the present invention will become more apparent from a consideration of the following detailed description and from the accompanying drawings.

DESCRIPTION OF THE DRAWINGS

FIG. 4C is an illustration of a 49 bump corner region arrangement in accordance with the current invention;

FIG. 4D is an illustration of a 64 bump corner region arrangement in accordance with the current invention;

DETAILED DESCRIPTION OF THE INVENTION

Figure 1:
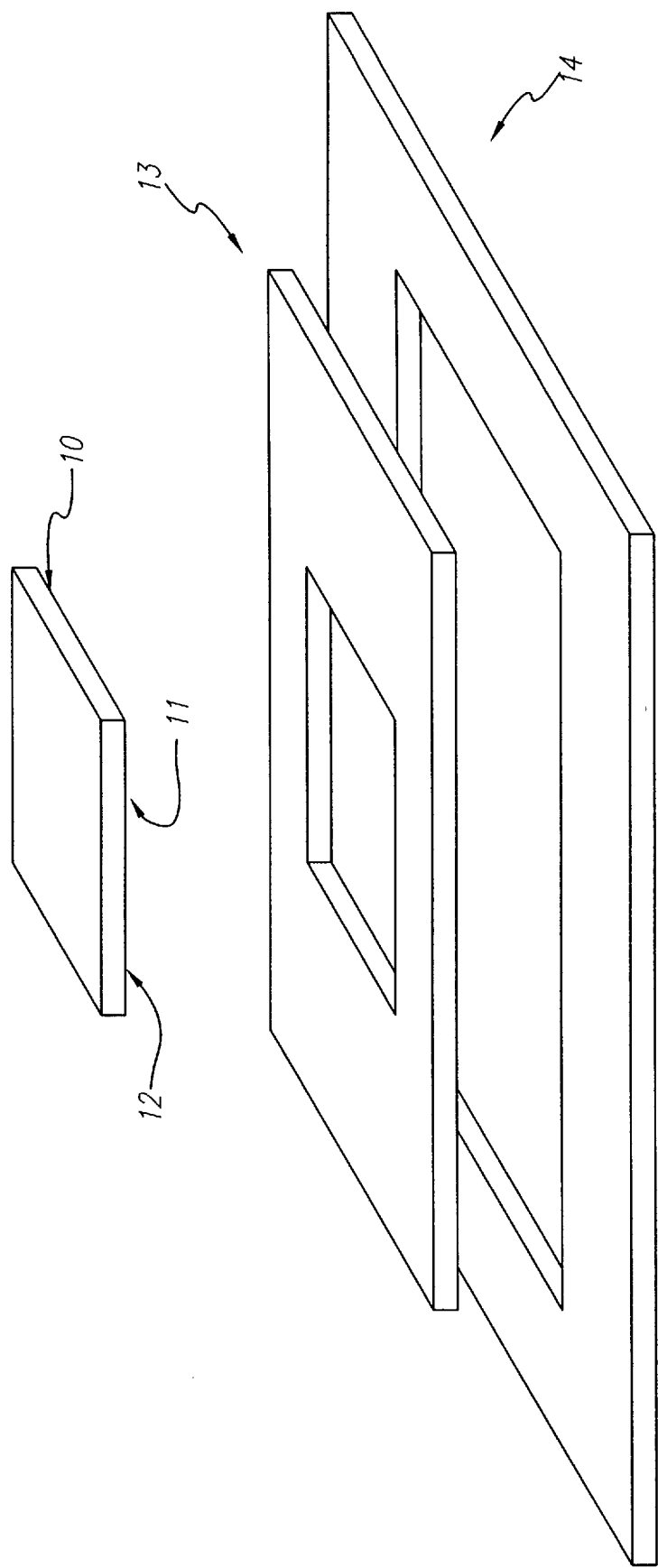
FIG. 1 is an illustration of the components used in mounting a semiconductor die.
Figure 2:
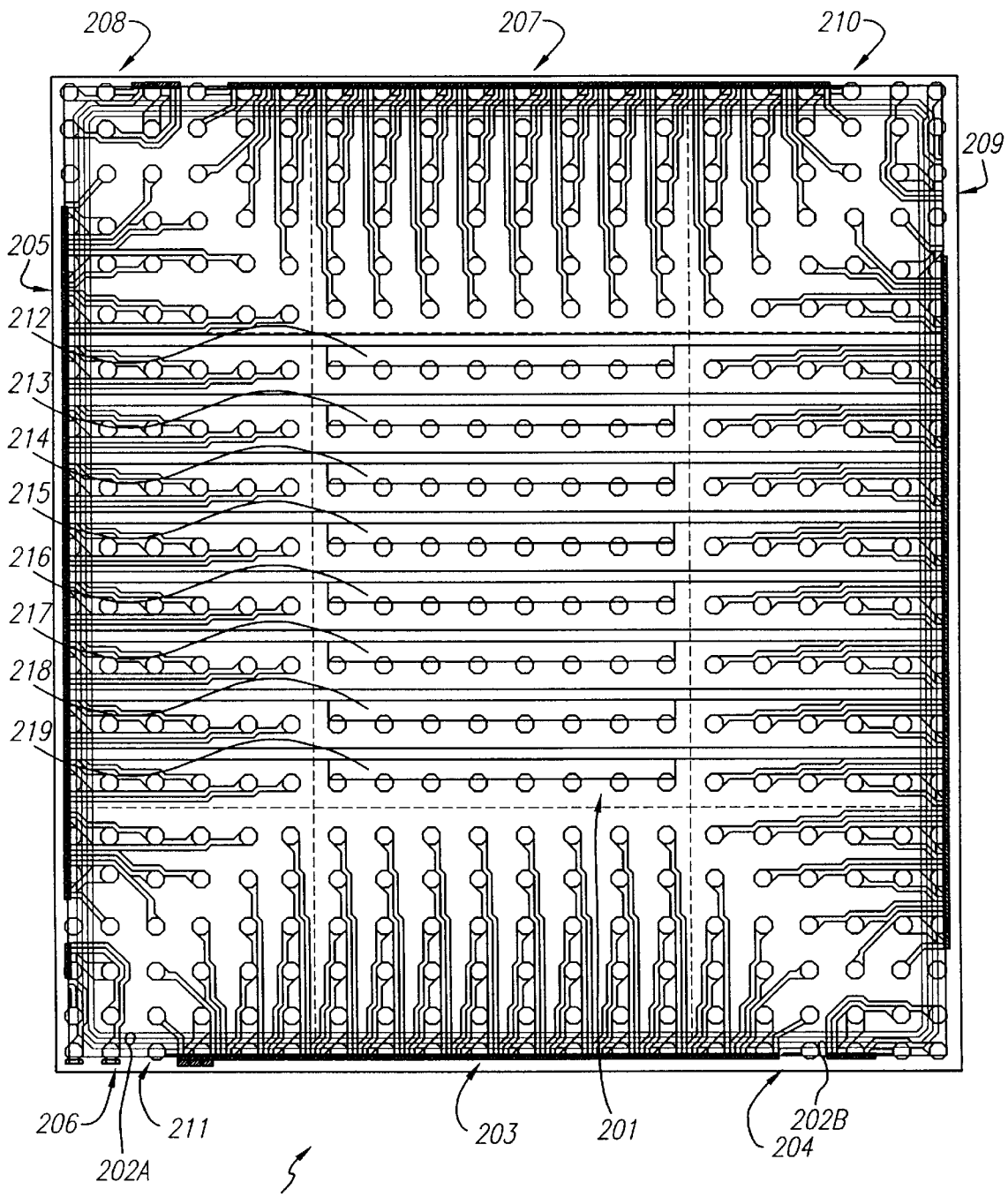
FIG. 2 illustrates implementation of an approximately five millimeter square flip-chip architecture having 400 bumps.

FIG. 1 illustrates a flip-chip semiconductor die 10 having a series of gates or other logic elements constructed on its downward-facing surface 11. The die is mounted to a substrate 13 which is then affixed to a motherboard 14. Die 10 is typically bonded to the substrate by solder bumps. FIG. 2 presents the arrangement on the surface 11 of semiconductor die 10. Flip-chip die 10 has dimensions of 5.0174 millimeters by 5.0524 millimeters, and located thereon is a set of 400 bumps or bump pads, comprising 20 rows of 20 bumps. Substrate 13 is composed of any laminate material, such as ceramic or plastic wire traces through the layers leading from its top surface to underneath. The bumps on die 10 are formed of a high quality metal.

Figure 4A:
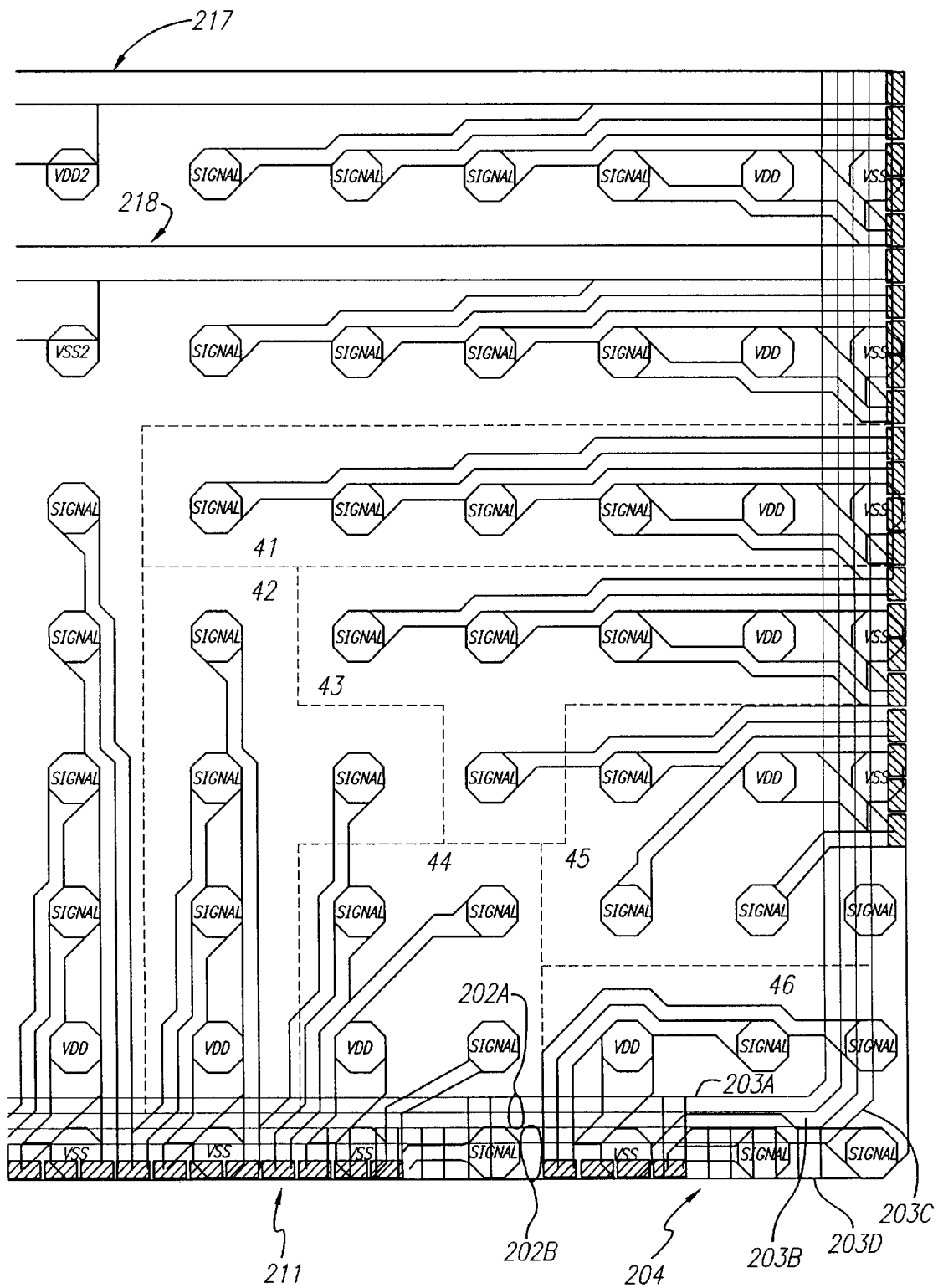
FIG. 4A is an illustration of a 36 bump corner region arrangement in accordance with the current invention.

Power core bump pad block 201 consists of 64 bumps which provide power to the core of the IC 12 and which transmit power to the peripheral power connections, or core power ring 202A, via a series of power rails 212–219. The power core bump pad block 201 consists of a series of linearly aligned bump pads. The power bumps on the surface of the die supply power and ground to logic circuitry within the integrated circuit 12. The power core bump pad block 201 illustrated in this preferred embodiment consists of four rows of Vss connections to the peripheral power ring 202 and four rows of Vdd connections connected to the peripheral power ring 202 via eight power rails 212–219. Peripheral power ring 202 is divided into core power ring 202A and I/O power ring 202B. As shown in FIG. 4A, core power ring 202A is divided into Vss core power ring 203A, Vdd core power ring 203B, Vdd I/O power ring 203C, and Vss I/O power ring 203D. The four rows of Vss bump pads alternate with the four rows of Vdd bump pads.

The die also comprises four edge regions 203, 205, 207, and 209, each edge region comprises a plurality of linearly aligned bump pad arrays, each linearly aligned bump pad array having four I/O bump pads, one Vdd bump pad, and one Vss bump pad, all linearly aligned. For the 20 by 20 arrangement of FIG. 1 there are eight bump pad arrays per edge region. Each edge region attaches to the peripheral I/O power ring 202B and borders the power core bump pad block 201.

The die 10 also has four corner regions 204, 206, 208 and 210, each having an arrangement of 36 bump pads per corner region. Orientation of the thirty six bump pads in each corner region 204, 206, 208 and 210 provides adequate power to the cells as well as sufficient I/O connections to provide power to the cell and I/O capability. All I/O bumps are connected to one of the set of I/O cells 211 lining the periphery of the cell. The pattern illustrated in FIG. 1 uses a single metal layer and provides power to the I/O cells 211 without dedicating individual slots for power use.

The method for arranging the die as shown in FIG. 1 requires first determining the ideal power/ground to signal ratio for the circuit. For every Vdd (power) and Vss (ground) power configuration, the die must comprise N I/O bumps based on the calculated ratio. For example, in the arrangement of FIG. 2, a four to one power/ground to signal ratio is possible, and for each Vdd and Vss power bump pad pair, N equals four because four I/O signals are provided, for a total of six bump pads. These six bump pads are arranged in columns and are replicated across the edge of the die 10 in edge regions 203, 205, 207 and 209. The corner regions are special cases, and the same six-by-six corner regions are used for all embodiments having a four to one signal to power ratio (FIG. 4A). The total number of columns on the face of the die 10 depends on the bump pitch, or distance between the bumps, where bump pitch is equal to N times the I/O device pitch, and N is an integer. For the preferred embodiment, I/O pitch is 63 micrometers, so the bump pad pitch is 252 micrometers (approximately 2.5 mils) for the four to one power ratio on the 5.0174 millimeter by 5.0524 millimeter die.

Figures 3, 4B:
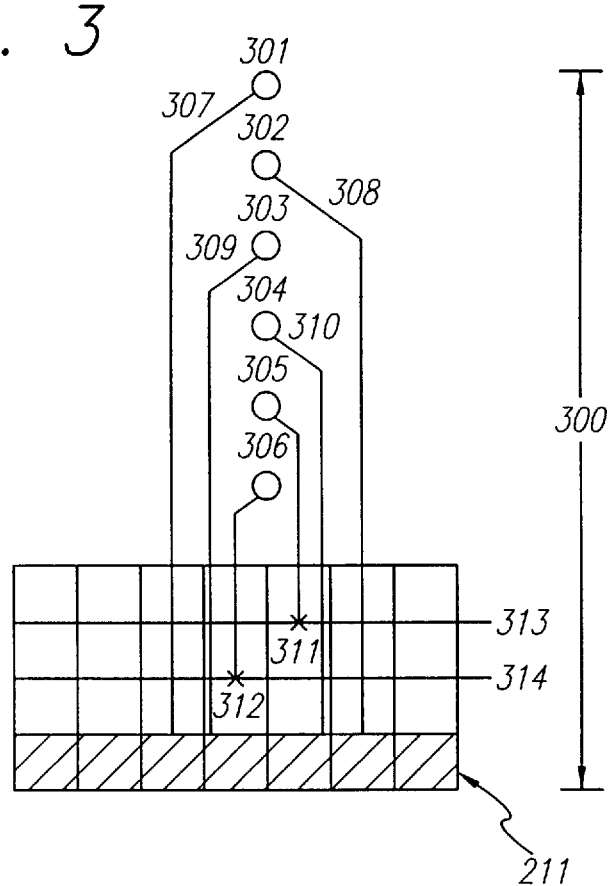
FIG. 3 shows the arrangement of an individual bump pad column, including an array of bumps and connections for I/O signals and power.
FIG. 4B is an illustration of a 25 bump corner region arrangement in accordance with the current invention.

An illustration of an arrangement of the linear bump pad array 300 is presented in FIG. 3. Each array 300 contains four I/O bump pads 301, 302, 303, and 304 and two power bump pads, a Vdd bump pad 305 and a Vss bump pad 306. These bump pads are arranged in a single column with the I/O bump pads 301, 302, 303, and 304 adjacent one another, the Vdd bump pad 305 neighboring the I/O bump pads, and the Vss bump pad 306 next to the Vdd bump pad 305. The Vss bump pad 306 is thus closest to the periphery of the die 10 and the power ring 202. I/O bump pad redistribution traces 307, 308, 309, and 310 couple the I/O bump pads 301, 302, 303 and 304 to the peripheral clusters of I/O cells 211.

Vdd (power) bump 305 is connected to Vdd bus 313 at power connection point 311, while Vss (ground) bump 306 intersects Vss bus 314 at ground connection point 312. This bump pad array 300 is replicated through all the edge regions 203, 205, 207 and 209.

The ratio of four I/O signals for each Vdd/Vss pair provides adequate power/ground to signal ratio to supply the die, i.e. a ratio of four to one. For arrangements allowing higher power/ground to signal ratios, such as five to one or more, the corner regions are arranged as shown in FIGS. 4B–D, and the corner regions for other dimensions are generated using the process of FIGS. 4E–F.

An alternate linear bump pad array arrangement reverses the locations of the signal bump pad 304 which is closest to the power bumps and the Vdd (power) bump 305. Such an arrangement thus comprises in order a series of three signal bump pads, the Vdd bump, the fourth signal bump pad, and the Vss bump.

The I/O bump pad redistribution traces 307, 308, 309, and 310 are wires which necessarily introduce resistance and inductance problems into the system. In order to provide balanced I/O signal resistance, inductance, and minimal parasitics, redistribution traces on adjacent linearly aligned bump pad arrays are arranged as mirror images of one another. For example, as shown in FIG. 3, first redistribution trace 307 is routed to the left of the bump pad array, second redistribution trace 308 to the right, third redistribution trace 309 to the left, and fourth redistribution trace 310 to the right. Adjacent linearly aligned bump pad arrays would have a first redistribution trace routed to the right of the bump pad array, second redistribution trace to the left, and so on to balance overall resistance, inductance, and parasitics.

The corner regions in each situation are special cases. The total size of each corner region is $(N+2)^2$ bumps, with N being an integer representing the total number of signals in each linearly aligned bump pad array. A single $(N+2)$ column is contained within each corner region. The remaining bump pads are arranged as special cases, such that power and I/O are provided to the peripheral edge of the die 10 to the I/O power ring 202B and the I/O cells 211. FIG. 4A illustrates the preferred embodiment of a corner region with a four to one signal to power ratio and where N equals four. This yields a six by six corner region arrangement. FIG. 4B illustrates a five by five corner region arrangement (N equal to three), while FIG. 4C is a seven by seven corner region, and FIG. 4D an eight by eight corner region. A flow chart for developing the corner region is presented in FIGS. 4E–F. As in these figures, corner regions must be square having dimensions $(N+2)^2$.

An expanded view of corner region 204 is shown in FIG. 4A. Each corner region consists of 24 I/O bump pads, six Vdd bump pads, and six Vss bump pads, for a total of 36 bump pads. The same interconnections to the power ring 202 and the plurality of I/O cells 211 are required and provided within the region. However, as all bump pads cannot be linearly aligned without sacrificing valuable corner space, a specialized arrangement and grouping of bump pads is required. Here, the corner region 204 is divided into six distinct sectors: a corner region standard sector 41, a first left corner region sector 42, a first top corner region sector 43, a second left corner region sector 44, a second top corner region sector 45, and a corner region edge sector 46.

The corner region standard sector 41 illustrated in FIG. 4A has a similar configuration to the linearly aligned bump pad array 300 illustrated in FIG. 3. The preferred embodiment of such an array is for the redistribution trace from the bump furthest from the edge of the die to radiate from the bump in the opposite direction as the next bump, as in FIG. 3. The first top corner region sector 42 comprises four I/O bump pads, one Vss bump pad, and one Vdd bump pad, not linearly aligned. The bumps have three signals, one Vdd and one Vss signal aligned in the column form suggested in FIG. 3, with an additional signal bump in the next leftmost remaining column. The first top corner region sector 43 comprises a similar three signals in the topmost row, one Vdd and one Vss signal aligned in row form as in FIG. 3. Again, first top corner region array group 43 contains an additional I/O signal bump in the next row at the leftmost side. The second left corner region sector 44 comprises one I/O bump pad, one Vss bump pad, and one Vdd bump pad, linearly aligned in the leftmost remaining row, and three I/O bumps in the next remaining leftmost row. Second top corner region sector 45 has a single I/O bump pad, a single Vss bump pad, and a single Vdd bump pad linearly aligned, and the three remaining I/O cells also linearly aligned in the next topmost row. The remaining bump pads are allocated to the corner region edge sector 46. All signals feed into respective I/O cell clusters. The layout of the first left corner region sector 42 is similar to and effectively the mirror image of first top corner region sector 43, and second left corner region sector 44 is similar to and effectively the mirror image of second top corner region sector 45. Placement of the Vdd and Vss bumps for all sectors is no further than two bumps from the peripheral edge of the die 10.

The corner region 204 depicted in FIG. 4A is used in all four corners of the die 10 and is available for any sized chip having 16 by 16 bumps or more on the surface 11 of the flip-chip die 10. The die surface must have a power core bump pad block 201 with dimensions of at least four by four, as smaller sized core bump dimensions do not provide both ground and power to the core.

Figure 4E:
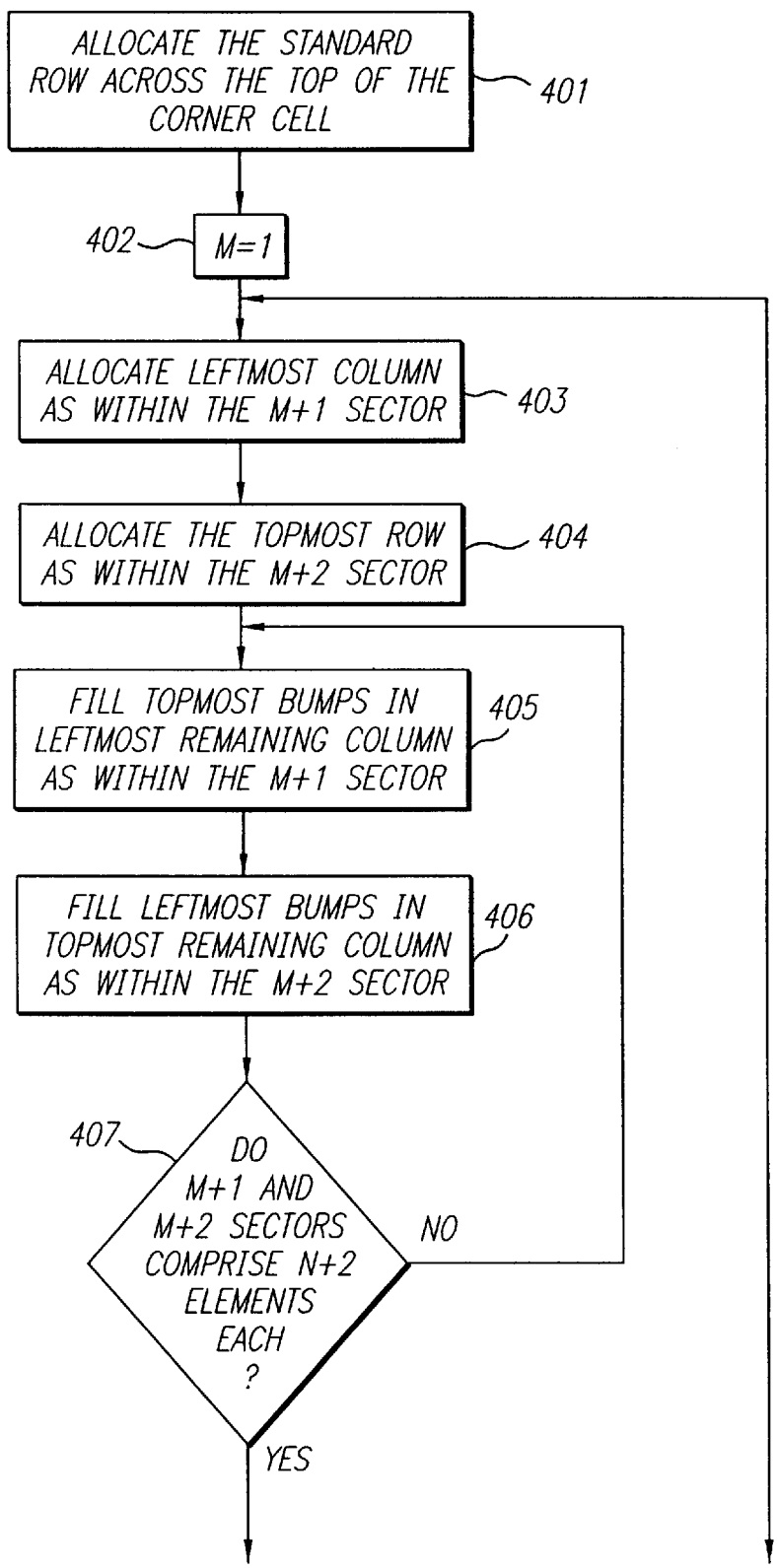
FIG. 4E and 4F are a flowchart demonstrating design of a corner region of dimension N+2 bumps by N+2 bumps, where N is the number of signals in an array.
Figure 4F:
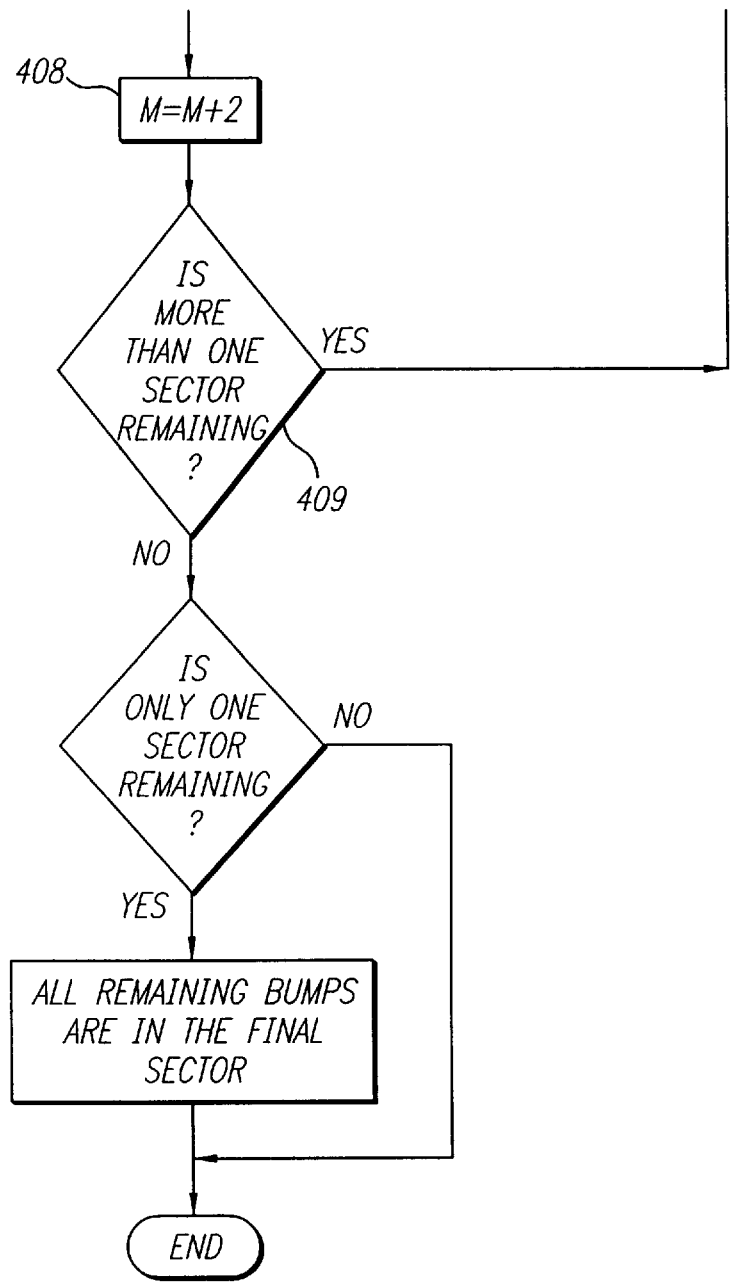

Referring now to FIGS. 4E–F, the flowchart illustrates the methodology in allocating bumps in a corner region of dimension N+2 by N+2. Standard row allocation step 401 creates the first corner region row across the topmost row of the corner region. This row is similar to a standard row as in the edge regions 203, 205, 207, and 209 of FIG. 1. A counter M is set to 1 in counter set step 402. In leftmost remaining column establishment step 403, within the leftmost remaining column, as many bump pads as may be located within the column are designated as the (M+1)th sector. In topmost remaining row establishment step 404, within the topmost remaining row, as many bump pads as may be located within the row are designated as the (M+2)th sector. In remainder of (M+1)th sector fill step 405, in the next leftmost remaining column, the (M+1)th sector is further filled with bump pads by locating bump pads from the top within the leftmost remaining column. In remainder of (M+2)th sector fill step 406, in the next topmost remaining row, the (M+1)th sector is further filled with bump pads by locating bump pads within the left of the topmost remaining row. In sector completion evaluation step 407, if the M+1 and M+2 sectors are complete, i.e. comprise N+2 elements each, M is set equal to M+2 in counter iteration step 408. If the M+1 and M+2 sectors are incomplete, i.e. comprise less than N+2 elements each, steps 405 and 406 are repeated by filling the leftmost remaining column and topmost remaining row with bump pads for the sector. This loop continues until the M+1 and M+2 sectors are complete. Multiple remaining sector evaluation step 409 determines if more than one sector remains. If so, the process after the counter set step 402 is iteratively repeated until one or no sector remains. In last sector evaluation step 410, if only one N+2 sector remains, all bump pads in that sector are allocated as the final sector.

After allocating the bumps for the corner region, the connections to the cells are allocated in a similar fashion to those shown in FIG. 4A. Connections between the bump pads and the I/O cells 204 and peripheral I/O power ring 202B require balanced I/O connections based on required resistance, conductance, and parasitic parameters. Again, a balanced array requires that the connection from the bump furthest from the power bumps in a linear array must emanate from the I/O bump in the opposite direction of the second furthest I/O bump as shown in the preferred embodiment of FIG. 3. This balancing in the topmost row of the corner region requires that the redistribution trace from the top left bump in the corner region 204 radiate upward while the redistribution trace from the second bump in the top row is downward. Vdd and Vss pads for each sector are implemented no more than two bump pads away from the edge of the cell, as shown in FIGS. 4A–D, and in sector arrangements spanning greater than three columns or rows, Vdd and Vss bumps should be located whenever possible to a single side rather than in the center of the sector, as with the corner region edge sector 46 of FIG. 4A. As shown in sectors 6 and 7 of FIG. 4C, such an arrangement is not always possible, and so leftmost and topmost skewing of the Vdd and Vss power is necessary. I/O signals are routed to the respective peripheral I/O cells 211. Thus, the corner region allocation process of FIG. 4E–F ensures that Vdd and Vss bump pads are located at the outside edge of the cell, and neither power nor ground is more than two bump pads away from the edge of the cell. This procedure guarantees adequate power and I/O for each corner region.

As may be appreciated from the arrangement shown in FIG. 2, the same basic bump design applies to larger bump pad matrices, and may apply to smaller sized arrays of at least 16 by 16 bumps with a four by four power core power bump pad block 11. For example, for a 30 by 30, or 900 bump pad arrangement, the same 36 bump pad corner regions 204, 206, 208 and 210 would occupy space on the die. The edge regions 203, 205, 207 and 209 would be of increased dimension, i.e. for a 900 bump pad arrangement the edge regions would have 18 bump pad arrays each. The power core bump pad block 201 in such an arrangement would increase to an 18 by 18 bump pad area, thereby providing increased power to the core.

The arrangement shown in FIG. 2 of corner regions 204, 206, 208, and 210, edge regions 203, 205, 207, and 209 and power core bump pad block 201 would also support a die 10 having rectangular dimensions. In such a design, the corner regions 204, 206, 208, and 210 remain square. Edge regions 203, 205, 207, and 209 remain an array of columns having N+2 bump pads, but the number of columns would increase or decrease to accommodate the dimensions of the rectangular die. The power core bump pad block 201 in such an arrangement would also have rectangular dimensions and the same plurality of power rails (although possibly increased in number) as shown in FIG. 2.

Figure 5:
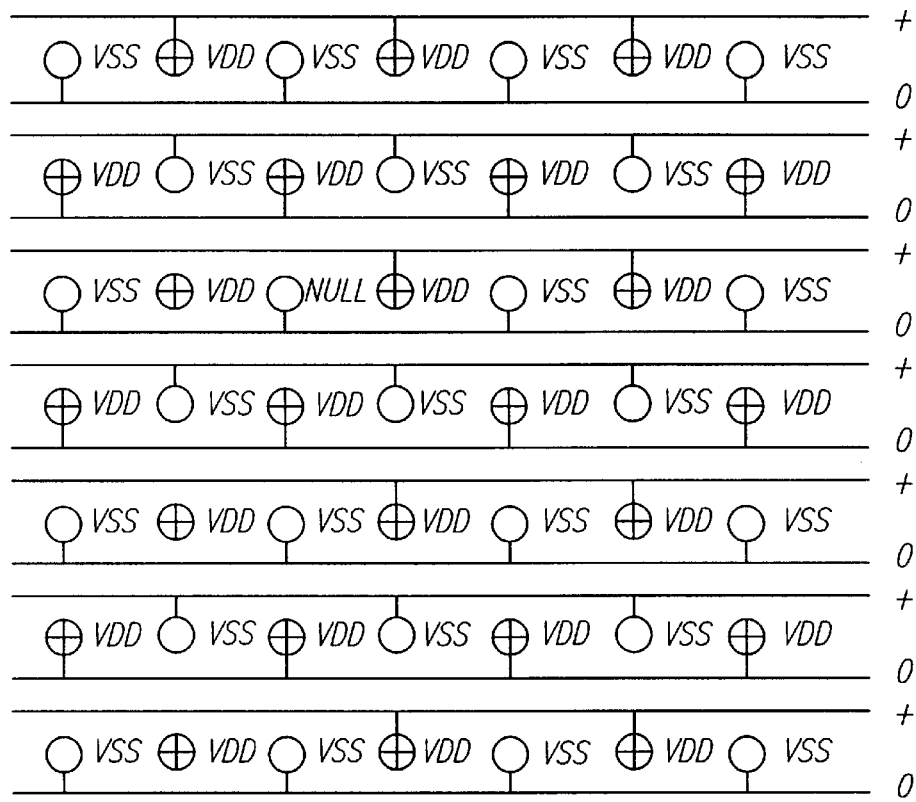
FIG. 5 is an alternate embodiment of the power core wherein the core has an odd number of bumps.

A further arrangement the die surface is illustrated in FIG. 5. The bump pad arrangement of the power core bump pad block 201 when the die 10 consists of an odd number of power core bump pads requires an alternate arrangement to overcome the inherent problem of having one additional row of power core bump pads, or one additional rail of either positive or ground which results. In such an odd-number of pads core, the second preferred embodiment is as illustrated in FIG. 5. The arrangement of FIG. 5 is a seven by seven power core bump pad block, with eight rows of connections from live bumps to power ring 202 and eight rows of connections from ground bumps to power ring 202. This "checkerboard" arrangement provides an equivalent number of ground and live voltage pads, with one additional bump pad per power core arrangement. As shown in FIG. 5, depending on power constraints, the extra bump in the upper left may be null, power, or ground. The core bump pad arrangement alternates rows of voltage connections to the power ring 202, while each bump pad connects to the appropriate adjacent power rail. This "checkerboard" pattern results in equivalent balanced voltage and ground connections to the power ring 202 and does not use one of the 49 bump pads, supporting an odd number of bumps with an even number of power rails.

Such an arrangement can be advantageous when used in connection with bump depopulation, where for manufacturing positioning concerns, a bump is removed from a regular pattern. To provide a balanced core array, the odd bump should be located toward the center of the core array, but manufacturing positioning based on bump depopulation is ineffective if the missing bump is located in the exact center of the core array.

As a third preferred embodiment, the positioning of the I/O cells on the die may be relocated from the periphery of the die and the core power cells may be moved from the center of the die. This third preferred embodiment provides I/O bump pads at the expense of the power core bump pad block 11, and uses the power rails to transmit power to and from the I/O signal ring 211, thereby providing a mixed core-I/O voltage arrangement. This embodiment is used is used in situations where a single core and I/O power supply is employed. This embodiment provides an alternative in a large bump arrangement on the surface of the die 10, where core power requirements are not as critical, or where signal/power ratios dictate an increased quantity of I/O bump pads can be supported or a decreased quantity of power bumps are necessary to support the die.

Figure 6:
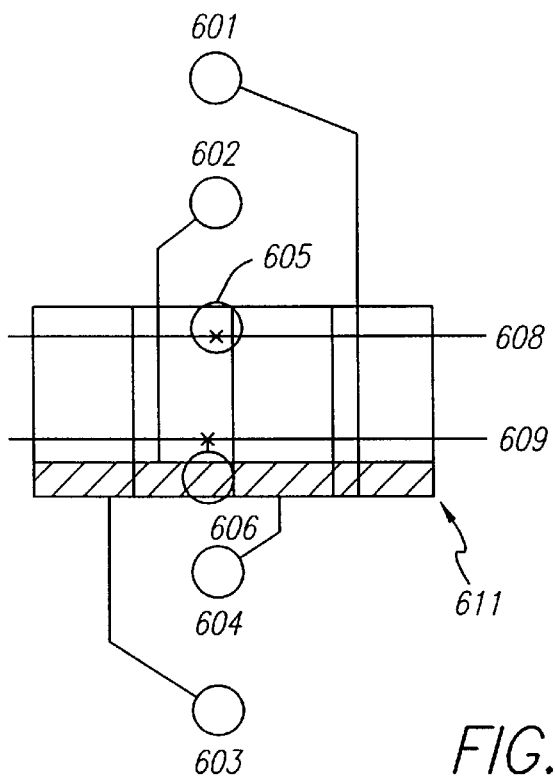
FIG. 6 is an alternate embodiment of an array for use with a die having decreased power or increased I/O requirements.

As shown in FIG. 6, for an arrangement having a four to one power ratio, the Vdd bus 608 and Vss bus 609 and I/O cells 611 are located in the middle of the bump pads, with I/O bumps 601 and 602 located above I/O cells 611 and I/O bumps 603 and 604 below the I/O cells 611. The Vdd voltage bump 605 and Vss ground bump 606 are centrally located and aligned with the I/O bumps 601–604. Power and ground are supplied via Vdd bus 608 and Vss bus 609.

Figure 7:
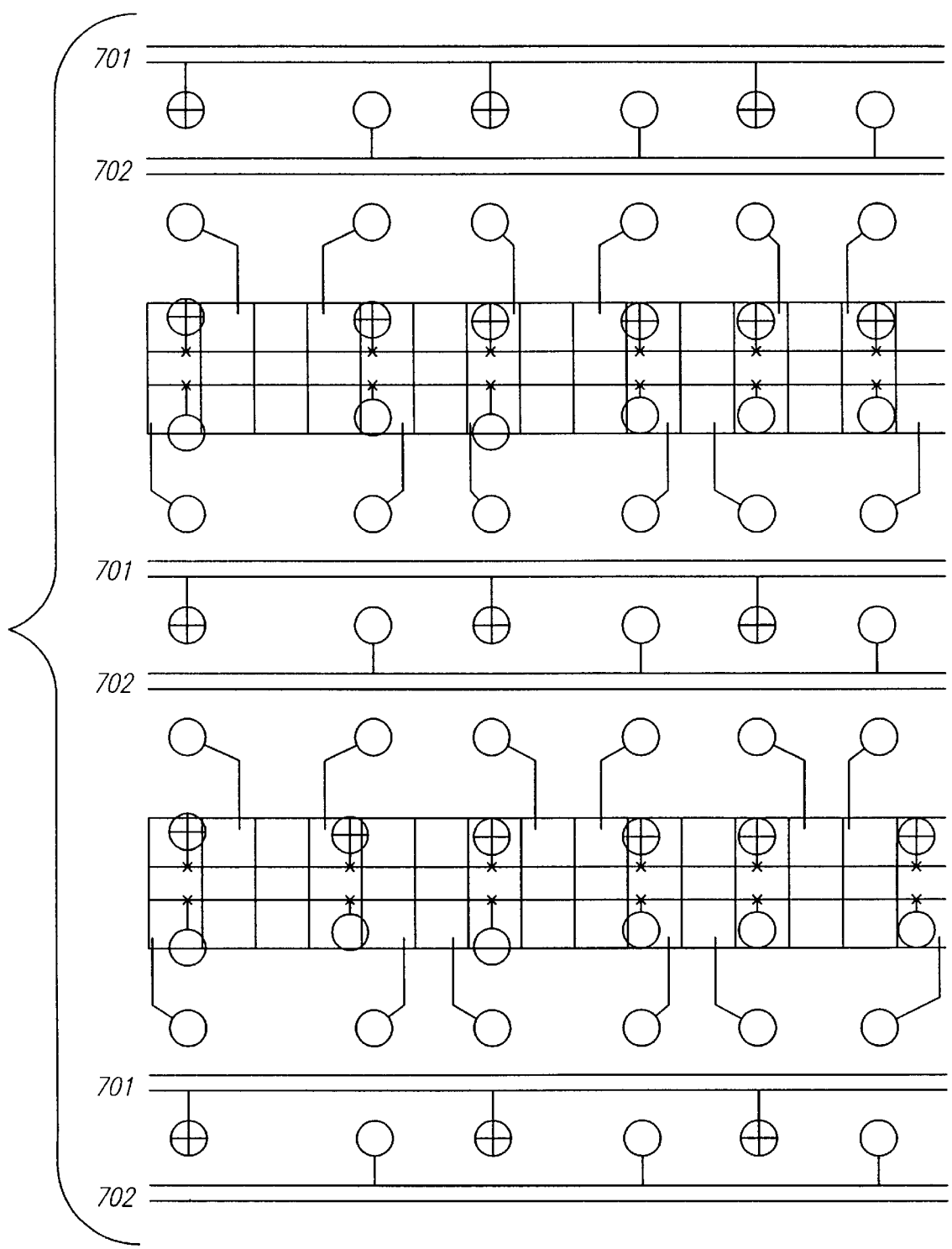
FIG. 7 is an implementation of a plurality of the arrays of FIG. 6 and associated power rails and bumps.

The elements of FIG. 6 are repeated over the die 10 and interspersed with the core power rails 701 and 702 shown in FIG. 7, thereby providing a separate core and I/O power arrangement. FIG. 7 illustrates an embodiment where N is 2, with two I/O cells and two power cells. I/O cells 611 are repeated along and across the die surface, providing the additional I/O for a fixed size region having less stringent power requirements. Power and I/O for this embodiment are routed to two edges of the die 10, and again a design supporting a rectangular die merely requires expanding the linear elements of FIG. 7 to accommodate die dimensions.

Note that in accordance with the design of the preferred embodiment, the direction of the redistribution trace between the topmost I/O bump 601 and the corresponding I/O cell 609 is preferably in the opposite direction of the second topmost I/O cell 602 and its corresponding I/O cell 610. The same is true of the bottom bumps and their respective I/O cells. The alternating trace arrangement for adjacent linearly aligned bumps outlined above should be employed for the configuration shown in FIG. 6. That is, where the top redistribution trace from bump 601 is routed to the right of the linear bump array, the adjacent linear bump array preferably has its top redistribution trace routed to the left of the linear bump array.

A signal to power ratio greater having an odd number, such as five to one, would require an odd number of bump pads per each ground and power pad to operate in accordance with the design of FIG. 7. In such a case, an odd number of I/O pads would be linearly aligned at one end of the power bumps, and an even number at the opposite end. The number of bumps above and below the power pads must differ by one, but it is of no importance that the higher number be above or below, or the odd number above or below. Again, as with the preferred embodiment and in accordance with FIG. 7, the redistribution traces between the topmost I/O bump and the I/O cells in a linear array and the redistribution traces of adjacent arrays must be opposite in direction to provide balanced resistance, inductance, and parasitics.

If the package supports an allocation of more bumps than are usable for the die, the additional bumps may be designated as extra power bumps so that as the die grows and requires additional power, these extra bumps may be used instead of requiring a complete redesign. For example, if the signal to power requirement for the embodiment shown in FIGS. 2 and 3 was only three to one, the result would be a requirement for fewer I/O bumps. Aside from a rewiring of the edge regions and creating corner regions having dimension 5 by 5, the additional row of bumps around the outside of power core bump pad block 201 could be allocated as power bumps and used for future upgrades to the die.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

I claim:

1. A method for designing a corner region arrangement of a plurality of I/O bump pads and power bump pads on a die having four edges, comprising the steps of:

establishing a corner region size based on the ratio of I/O bump pads to power bump pads;

designating a first bump pad row;

setting a counter M to one;

designing an M+1 sector by designating as many bump pads as may be located within the leftmost column to belong to the M+1 sector;

designing an M+2 sector by designating as many bump pads as may be located within the topmost row to belong to the M+2 sector;

filling the remainder of the M+1 sector by designating bump pads within the top of the leftmost remaining column to belong to the sector;

filling the remainder of the M+2 sector by designating bump pads on the left of the topmost remaining row to belong to the sector;

evaluating whether the sector is complete, and if the sector is incomplete, repeating said M+1 filling step and said M+2 filling step until the sector is complete;

incrementing the counter to M+2;

deciding whether more than one sector remains, and repeating said M+1 sector design step and all subsequent steps when one more than one sector remains until one or less sectors remain; and determining whether one sector remains and if one sector remains designating all remaining undesignated bumps to the final sector.

2. The method of claim 1 further comprising the step of designating two bump pads in each sector closest to an edge of the die as power bump pads, wherein said two bump pad designating step is subsequent to said one sector remaining determining step.

3. The method of claim 2 further comprising the step of providing balanced connections between said bump pads and a power ring and a plurality of I/O cells located near the edge of said die.

4. A method for arranging bump pads on a surface of an integrated circuit die, comprising the steps of:

providing a first signal bump pad;

connecting a first end of a first trace to said first signal bump pad;

connecting a second end of said first trace to a first input/output cell, wherein said first trace radiates in a first direction;

providing a second signal bump pad;

connecting a first end of a second trace to said second signal bump pad;

connecting a second end of said second trace to a second input/output cell, said second trace radiates in a second direction, and said first direction is opposite said second direction;

disposing said first trace and said second trace on opposite sides of a first line defined by said first signal bump pad and said second signal bump pad;

providing a first power bump pad having a third trace radiating in said first direction and connecting to a first power bus;

providing a second power bump pad having a fourth trace radiating in said second direction and connecting to a second power bus, said third trace and said fourth trace disposed on opposite sides of a second line defined by said first power bump pad and said second power bump pad;

disposing said first signal bump pad closer to a center of said integrated circuit die than said first power bump pad; and disposing said second signal bump pad closer to said center of said integrated circuit die than said second power bump pad.

5. The method of claim 4 further comprising the step of providing a core power region located centrally on said integrated circuit die, said step of providing said core power region comprising the steps of:

providing a first power rail;

providing a second power rail;

providing a first plurality of power bump pads of a first type and coupling to said first power rail;

providing a second plurality of power bump pads of a second type and coupling to said second power rail; and disposing said first plurality of power bump pads of said first type and said second plurality of power bump pads of said second type in an alternating manner between said first power rail and second power rail.

6. The method of claim 5 further comprising the step of arranging said first and second lines substantially coincident with each other.

7. The method of claim 6 further comprising the step of arranging said first and second directions substantially opposite to each other.

8. The method of claim 7 wherein said first type is a power supply and said second type is a ground.

9. A method for distributing pads on a surface of a semiconductor die, said method comprising the steps of:

calculating a power-signal ratio;

establishing a number N of I/O bump pads to be allocated per pair of power bump pads based on the power-signal ratio;

arranging said N I/O bump pads and pair of said power bump pads linearly and repeating said linear arrangement within four edge groups on said surface of said die;

identifying four corner regions, one corner region in each corner of the die surface; and arranging a core power group within a center of said edge groups and said corner regions.

10. The method of claim 9 wherein said N I/O bump pads and pair of said power bump pads are arranged in a column and are replicated across an edge of said die in said edge groups.

11. The method of claim 9 wherein said identifying said corner regions comprises the steps of:

establishing a corner region size based on the ratio of said N I/O bump pads to said power bump pads;

designating a first bump pad row;

setting a counter M to one:

designing an M+1 sector by designating as many bump pads as may be located within a leftmost column to belong to said M+1 sector;

designing an M+2 sector by designating as many bump pads as may be located within a topmost row to belong to said M+2 sector;

filling the remainder of said M+1 sector by designating bump pads within the top of a leftmost remaining column to belong to said M+1 sector;

filing the remainder of said M+2 sector by designating bump pads on the left of a topmost remaining row to belong to said M+2 sector;

evaluating whether said M+1 and said M+2 sectors are complete, and if the sector is incomplete, repeating said M+1 filling step and said M+2 filling step until said sectors are complete;

incrementing the counter to M+2;

deciding whether more than one sector remains, and repeating said M+1 sector design step and all subsequent steps when one more than one sector remains until one or less sectors remain; and determining whether one sector remains and if one sector remains designating all remaining undesignated bump pads to the final sector.

12. The method of claim 11 further comprising the step of designating two bump pads in each sector closest to an edge of the die as power bump pads, wherein said two bump pad designating step is subsequent to said one sector remaining determining step.

13. The method of claim 12 further comprising the step of providing balanced connections between said bump pads and a power ring and a plurality of I/O cells located near the edge of said die.

14. A method for arranging bump pads on a surface of an integrated circuit die, comprising the steps of:

providing a first power bus on said surface of said integrated circuit die;

providing a second power bus on said surface of said integrated circuit die;

providing a first bump pad having a first trace radiating in a first direction;

connecting said first trace to a first input/output cell;

providing a second signal bump pad having a second trace radiating in a second direction different from the first direction;

connecting said second trace to a second input/output cell;

disposing said first trace and said second trace on opposite sides of a first line defined by said first signal bump pad and said second signal bump pad;

providing a third signal bump pad having a third trace radiating in said first direction;

connecting said third trace to a third input/output cell;

providing a fourth signal bump pad having a fourth trace radiating in said second direction;

connecting said fourth trace to a fourth input/output cell;

disposing said third trace and said fourth trace on opposite sides of a second line defined by said third signal bump and said fourth signal bump;

providing a first power bump pad and connecting to said first power bus;

providing a second power bump pad and connecting to said second power bus;

disposing said first and second signal bump pads on an opposite side of said first power bus from said third and fourth signal bumps;

disposing said first signal bump pad farther from said first power than said second signal bump pad; and disposing said fourth signal bump pad farther from said first power bus than said third signal bump pad.

15. The method of claim 14 further comprising the steps of:

providing a first power rail;

providing a second power rail;

coupling a first plurality of power bump pads of a first type to said first power rail;

coupling a second plurality of power bump pads of a second type to said second power rail; and disposing said first plurality of power bump pads of said first type and said second plurality of power bump pads of said second type in an alternating fashion between said first power rail and second power rail.

16. The method of claim 15 further comprising the step of arranging said first and second lines substantially coincident with each other.

17. The method of claim 16 further comprising the step of arranging said first and second directions substantially opposite to each other.

18. The method of claim 17 wherein said first type is a power supply and said second type is a ground.

19. A method for arranging bump pads on a surface of a flip-chip die, comprising the steps of:

providing at least one power bump;

linearly aligning a plurality of input/output bumps, wherein said linearly aligned plurality of input/output bumps are aligned with said at least one power bump;

positioning said at least one power bump intermediate among said linearly aligned plurality of input/output bumps;

forming said at least one power bump and said linearly aligned plurality of input/output bumps in an array; and replicating said array linearly across said flip-chip die, thereby forming a linear bump array arrangement.

* * * * *